United States Patent
Imafuku et al.

(10) Patent No.: US 7,207,340 B2
(45) Date of Patent: Apr. 24, 2007

(54) METHOD AND SYSTEM FOR REMOVAL OF GAS AND PLASMA PROCESSING APPARATUS

(75) Inventors: Kosuke Imafuku, Yamanashi (JP); Daisuke Hayashi, Yamanashi (JP)

(73) Assignee: Tokyo Electric Limited, Tokyo (JP)

( * ) Notice: Subject to any disclaimer, the term of this patent is extended or adjusted under 35 U.S.C. 154(b) by 366 days.

(21) Appl. No.: 10/433,781

(22) PCT Filed: Dec. 7, 2001

(86) PCT No.: PCT/JP01/10714

§ 371 (c)(1), (2), (4) Date: Jun. 6, 2003

(87) PCT Pub. No.: WO02/49755

PCT Pub. Date: Jun. 27, 2002

(65) Prior Publication Data

US 2004/0043721 A1    Mar. 4, 2004

(30) Foreign Application Priority Data

Dec. 8, 2000    (JP)    ............................. 2000-374438

(51) Int. Cl.
*B08B 7/00*    (2006.01)
(52) U.S. Cl. ............................. 134/56 R; 134/166 R; 134/902
(58) Field of Classification Search ............... 134/21, 134/22.1, 22.18, 30, 37, 1.1, 2, 3, 18, 56 R, 134/166 R, 902
See application file for complete search history.

(56) References Cited

U.S. PATENT DOCUMENTS 4,697,421 A * 10/1987 Otobe et al. .................. 60/602
6,024,105 A    2/2000 Hanazaki et al.
2001/0035154 A1* 11/2001 Yamaguchi et al. ........ 123/308

FOREIGN PATENT DOCUMENTS

| JP | 63-070428 | * | 3/1988 |
| JP | 05-259133 | | 10/1993 |
| JP | 10-152652 | | 5/1998 |
| JP | 11-054485 | | 2/1999 |
| JP | 2000-277491 | | 10/2000 |
| JP | 2000-277491 A | * | 10/2000 |

* cited by examiner

*Primary Examiner*—Zeinab El-Arini
(74) *Attorney, Agent, or Firm*—Finnegan, Henderson, Farabow, Garrett & Dunner, L.L.P.

(57) ABSTRACT

A gas removal system that removes a halogen gas remaining inside a processing chamber after executing a specific type of processing inside the processing chamber maintained in an airtight state with plasma obtained through discharge dissociation of the halogen gas supplied from a gas supply device comprises a pressure control device that controls the pressure inside the processing chamber, an air supply device that supplies the atmospheric air into the processing chamber after the pressure inside the processing chamber is lowered by the pressure control device, a control device that controls the air supply device and an evacuation device that evacuates a gas produced through a reaction of the halogen gas and the atmospheric air having occurred inside the processing chamber.

8 Claims, 8 Drawing Sheets

METHOD AND SYSTEM FOR REMOVAL OF GAS AND PLASMA PROCESSING APPARATUS

CROSS REFERENCE TO RELATED APPLICATIONS

This application is a national phase application based on PCT/JP01/10714, filed Dec. 7, 2001, the content of which is incorporated herein by reference, and claims the priority of Japanese Patent Application no. 2000-374438, filed Dec. 8, 2000, the content of which is incorporated herein by reference.

BACKGROUND OF THE INVENTION

1. Field of the Invention

The present invention relates to a gas removal method, a gas removal system and a plasma processing apparatus that are ideal in applications in which plasma processing is executed with a gas containing halogen (a halogen gas).

2. Description of the Related Art

Plasma processing apparatuses that execute plasma processing by using a halogen gas such as a chlorine-based gas are utilized in the field of semiconductor production in the related art. During an etching process executed by using a chlorine-based gas, a chlorine-based reaction product becomes deposited at the inner wall surfaces of the processing chamber and internal members constituting the processing apparatus and the etching process is adversely affected by the chlorine-based reaction product deposit. For this reason, it is necessary to regularly clean the inside of the processing chamber with an organic solvent such as alcohol. However, the chlorine-based gas, as well as the chlorine-based reaction product, is present inside the processing chamber immediately after the process and it is dangerous to open the processing chamber in such a state.

Accordingly, the chlorine-based gas is removed while maintaining the processing chamber in an airtight state in the related art. When the atmospheric air and N2 are supplied into the processing chamber in a sealed state, the chlorine-based gas is transformed to acid by the moisture contained in the atmospheric air. By evacuating this acid through an acid evacuation line, the chlorine-based gas is removed from the processing chamber. Only after the chlorine-based gas is removed as described above and safety is thus assured, the processing chamber is opened to the atmosphere for cleaning.

However, since the atmospheric air and N2 are supplied into the sealed processing chamber, there is a limit to the quantities of atmospheric air and N2 that can be taken in and it takes a considerable length of time to supply the atmospheric air and N2 and to transform the chlorine-based gas to acid in the related art described above. It takes as long as approximately 300 minutes to lower the chlorine-based gas concentration to the level at which the processing chamber can be safely opened, i.e., under 2 ppm, in a standard plasma processing apparatus, to lead to an increase in the down time of the apparatus and a poor operating rate.

SUMMARY OF THE INVENTION

An object of the present invention, which has been completed by addressing the problems of the related art discussed above, is to provide a new ad improved gas removal method and a new and improved gas removal system that make it possible to reduce the length of time required to remove the halogen gas in the processing chamber and a plasma processing apparatus adopting the gas removal method and the gas removal system.

In order to achieve the object described above, in a first aspect of the present invention, a gas removal method for removing a halogen gas remaining in a processing chamber after executing a specific type of processing inside the processing chamber in an airtight state with plasma obtained through discharge dissociation of the halogen gas, comprises a step in which the pressure inside the processing chamber is reduced to a level lower than the atmospheric pressure, a step in which atmospheric air is supplied into the processing chamber and a step in which a gas produced through a reaction of the halogen gas and the atmospheric air having occurred inside the processing chamber is evacuated.

By adopting this gas removal method in which the pressure inside the processing chamber is reduced to a level that is at least lower than the atmospheric pressure (reduced to a negative pressure), the gas is not allowed to become diffused to the outside of the processing chamber when the atmospheric air is supplied into the processing chamber. In addition, since the pressure inside the processing chamber is sustained at a low level, the atmospheric air can be supplied with ease. As a result, the reaction product resulting from the reaction of the supplied atmospheric air and the gas present in the processing gas can be evacuated to achieve fast and reliable gas removal. Furthermore, since the pressure inside the processing chamber is sustained at a negative level, there is no irritating odor of the gas and the gas leakage detector does not go off during the subsequent maintenance work, thereby assuring safety of the maintenance personnel.

It is desirable that the atmospheric air be supplied into the processing chamber by using a supply path through which the process gas used for the plasma processing is supplied into the processing chamber. Since the process gas supply device used to supply the process gas for the plasma processing and the system utilized to supply the atmospheric air into the processing chamber can be partially integrated in this manner, the gas can be evacuated through a simpler structure. In addition, since a large drive system is not required, the gas removal can be automated with ease.

Moreover, during the step in which the atmospheric air is supplied into the processing chamber, the processing chamber may be opened to the atmosphere. Since the atmospheric air can be taken in a large quantity by opening the processing chamber to the atmosphere, the length of time required for the gas removal can be greatly reduced.

The halogen gas may be a chlorine-based gas such as chlorine or it may be a bromine-based gas such as hydrogen bromide.

In order to achieve the object described above, a gas removal system that removes a halogen gas remaining inside a processing chamber after executing a specific type of processing inside the processing chamber in an airtight state with plasma obtained through discharge dissociation of a process gas containing the halogen gas supplied from a process gas supply device comprising a pressure control device that controls the pressure inside the processing chamber, an air supply device that supplies atmospheric air into the processing chamber after lowering the pressure inside the processing chamber with the pressure control device, a control device that controls the air supply device and an evacuation device that evacuates a gas produced through a reaction of the halogen gas and the atmospheric air having occurred in the processing chamber is provided in a second aspect of the present invention.

By adopting this gas removal system in which the pressure inside the processing chamber is reduced to a level that is at least lower than the atmospheric pressure (reduced to a negative pressure), the gas is not allowed to become diffused to the outside of the processing chamber when the atmospheric air is supplied into the processing chamber. In addition, since the pressure inside the processing chamber is sustained at a lower level, the atmospheric air can be supplied with ease. As a result, the reaction product resulting from the reaction of the supplied atmospheric air and the gas present in the processing gas can be evacuated and the gas can be removed promptly with a high degree of reliability. In addition, since the pressure inside the processing chamber is sustained at a negative level, there is no irritating odor of the gas and the gas leakage detector does not go off during the subsequent maintenance work, thereby assuring safety of the maintenance personnel.

It is desirable that the air supply device supply the atmospheric air into the processing chamber via a supply port through which the process gas is supplied by the process gas supply device into the processing chamber or that a supply path through which the process gas is supplied into the processing chamber by the process gas supply device be partially shared by the gas supply device. Since this achieves a partial integration of the process gas supply device which supplies the process gas for the plasma processing and the air supply device which supplies the atmospheric air into the processing chamber, the gas can be evacuated through a simple structure. In addition, since a large drive system is not required, the gas removal system can be automated with ease.

Alternatively, the air supply device may supply the atmospheric air into the processing chamber via a supply port other than the supply port through which the process gas is supplied into the processing chamber by the air supply device. By adopting such a structure, too, the gas can be promptly removed with a high degree of reliability, and since a large drive system is not required, the gas removal system can be automated with ease.

Furthermore, the air supply device may comprise an atmosphere opening device that opens the processing chamber to the atmosphere. Since the atmospheric air can be taken in large quantity into the processing chamber by providing such an atmosphere opening device, the length of time required for the gas removal can be greatly reduced.

The atmosphere opening device may comprise a rotating mechanism for the process gas supply device. By opening the processing chamber to the atmosphere by utilizing the rotating mechanism of the process gas supply device, the gas removal system can be achieved without having to greatly modify the structure of the processing apparatus.

It is desirable that a sensor which detects the extent to which the processing chamber is open to the atmosphere by the means for atmosphere opening be provided to facilitate the gas removal control.

As an example, the gas removal control achieved by utilizing the sensor may adopt the following structure. Namely, the processing chamber may be opened to the atmosphere by the means for atmosphere opening to a first degree at which the processing chamber is not opened to the atmosphere at all, a second degree at which the processing chamber is opened to the atmosphere to a predetermined extent to remove the gas or a third degree at which the processing chamber is completely opened to the atmosphere, and the sensor may comprise a first sensor having a detection range from the first degree to the second degree and a second sensor having a detection range from the second degree to the third degree.

This structure facilitates verification of the state of the processing chamber by using the first sensor and the second sensor, i.e., if the processing chamber is in a fully closed state, if the process of gas removal is in progress at the processing chamber or if the processing chamber is in a fully open state. For instance, a light emitting diode may emit light in response to a signal provided by the first or second sensor to alert the operator to the state of the processing chamber and the means for atmosphere opening.

The degree to which the processing chamber is open to the atmosphere for gas removal (the second degree) should be set to, for instance, approximately 2% of the degree at which the processing chamber is completely open (the third degree). It is to be noted that the second degree does not need to be fixed at 2% of the third degree, and it can be adjusted in correspondence to the pressure inside the processing chamber. Namely, the extent to which the processing chamber is open to the atmosphere during gas removal can be increased as the pressure inside the processing chamber becomes lower.

In addition, it is desirable that the means for atmosphere opening issue a warning if the first sensor detects that the extent to which the processing chamber is open to the atmosphere is the first degree before a predetermined length of time elapses. The predetermined length of time in this case refers to the length of time that must elapse before a gas concentration level at which the processing chamber can be opened safely is achieved following a gas removal executed through the gas removal system according to the present invention. By issuing a warning if the processing chamber enters the fully closed state (i.e., if the first sensor detects that the processing chamber is open to the atmosphere to the first degree) before the gas concentration level at which the processing chamber can be safely opened is achieved, an efficient gas removal is assured.

Moreover, it is desirable that the means for atmosphere opening issue a warning if the second sensor detects that the extent to which the processing chamber is open to the atmosphere is the third degree before a predetermined length of time elapses. The predetermined length of time in this case refers to the length of time that must elapse before a gas concentration level at which the processing chamber can be opened safely is achieved following a gas removal executed through the gas removal system according to the present invention. By issuing a warning if the processing chamber enters the fully open state (i.e., if the second sensor detects that the processing chamber is open to the atmosphere to the third degree) before the gas concentration level at which the processing chamber can be safely opened is achieved, any leakage of the gas is prevented and the safety of the chlorine-based gas removal process is increased.

The halogen gas may be a chlorine-based gas such as chlorine or it may be a bromine-based gas such as hydrogen bromide.

In addition, the present invention provides a plasma processing apparatus employed to execute plasma processing on a workpiece inside a processing chamber, which removes the gas inside the processing chamber by utilizing the gas removal system achieving outstanding advantages as described above.

DETAILED DESCRIPTION OF THE PREFERRED EMBODIMENTS

The following is a detailed explanation of the preferred embodiments of the gas removal method, the gas removal system and the plasma processing apparatus according to the present invention, given in reference to the attached drawings. It is to be noted that in the specification and the drawings, the same reference numerals are assigned to components achieving substantially identical functions and structural features to preclude the necessity for a repeated explanation thereof. It is to be also noted that the term "halogen gas" used in the description of the present invention specifically refers to a chlorine-based gas such as $Cl_2$ or a bromine-based gas such as HBr (hydrogen bromide) that is likely to generate a hazardous substance when it reacts mainly with the atmospheric air. The following explanation is given on the assumption that a chlorine-based gas such as $Cl_2$ is used.

(Basic Structure of Plasma Processing Apparatus)

Figure 1:
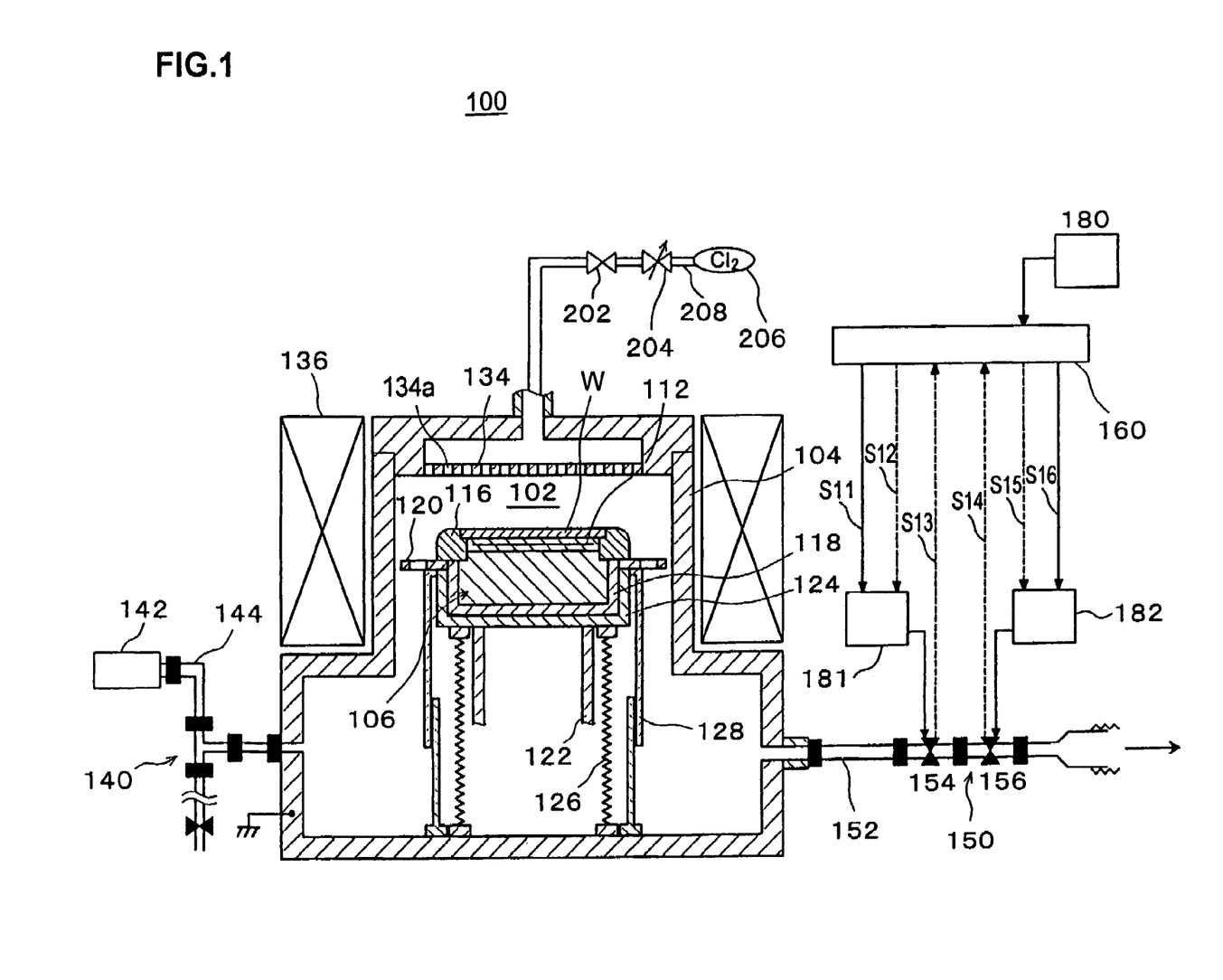
FIG. 1 schematically illustrates a plasma processing apparatus.

First, in reference to FIG. 1, the basic structure of a plasma processing apparatus 100 according to the present invention is explained.

A processing chamber 102 of the plasma processing apparatus 100 is formed inside an airtight and electrically conductive processing container 104. An electrically conductive lower electrode 106 is provided inside the processing chamber 102. The lower electrode 106 also functions as a stage on which a workpiece such as a semiconductor wafer (hereafter referred to as a "wafer" W is placed.

In addition, an electrostatic chuck 112 is provided at the surface of the lower electrode 106 on which the workpiece is placed. When a high DC voltage is applied to the electrostatic chuck 112, it firmly holds the wafer W placed on the chuck surface. In addition, an insulating ring body 116 is provided at the lower electrode 106 so as to enclose the wafer W placed on the electrostatic chuck 112. A baffle plate 120 is provided via an insulating member 118 around the lower electrode 106.

An elevator shaft 122 is connected to the lower electrode 106 via an electrically conductive member 124 and the insulating member 118. Thus, the lower electrode 106 is made to move upward/downward as a drive mechanism (not shown) connected to the elevator shaft 122 engages in operation. In addition, a bellows 126 constituted of an electrically conductive and airtight member capable of expanding and contracting and an electrically conductive bellows cover 128 are provided around the elevator shaft 122. The bellows 126 and the 128 are each connected to the electrically conductive member 124 and the bottom of the processing container 104 at the two ends.

An upper electrode 134 is also provided inside the processing chamber 102 so as to face opposite the mounting surface of the lower electrode 106 on which the workpiece is placed. The upper electrode 134 also constitutes part of a process gas supply device 200 that supplies a process gas used to execute a specific type of processing with plasma. At the outlet-side end of the process gas supply device 200, i.e., at the portion of the upper electrode 134 facing the internal space of the processing chamber, numerous gas outlet holes 134a are formed to function as process gas supply ports. In addition, a chlorine-based gas supply system 208 or the like that supplies, for instance, a chlorine-based gas such as $Cl_2$ is connected to the gas outlet holes 134a.

The chlorine-based gas supply system 208 is connected with a chlorine-based gas supply source 206 from which the chlorine-based gas is supplied via a switching valve 202 and a flow-regulating valve 204.

A magnet 136 is provided outside the side wall of the processing chamber 102. The magnet 136 is capable of forming a rotating magnetic field between the upper electrode 134 and the lower electrode 106.

It is to be noted that components that do not bear direct relevance to the present invention are not mentioned in the explanation given in reference to FIG. 1. In addition, the present invention is not limited to the plasma processing apparatus 100 described above and it may be adopted in all types of processing apparatuses. For instance, it may be adopted in a plasma etching apparatus with no magnet or a plasma etching apparatus in which high-frequency power is applied to the lower electrode alone (or the upper electrode alone).

Next, three embodiments of the halogen gas removal system and, more specifically, the air supply device, that characterizes the present invention are explained.

(First Embodiment)

Figure 2:
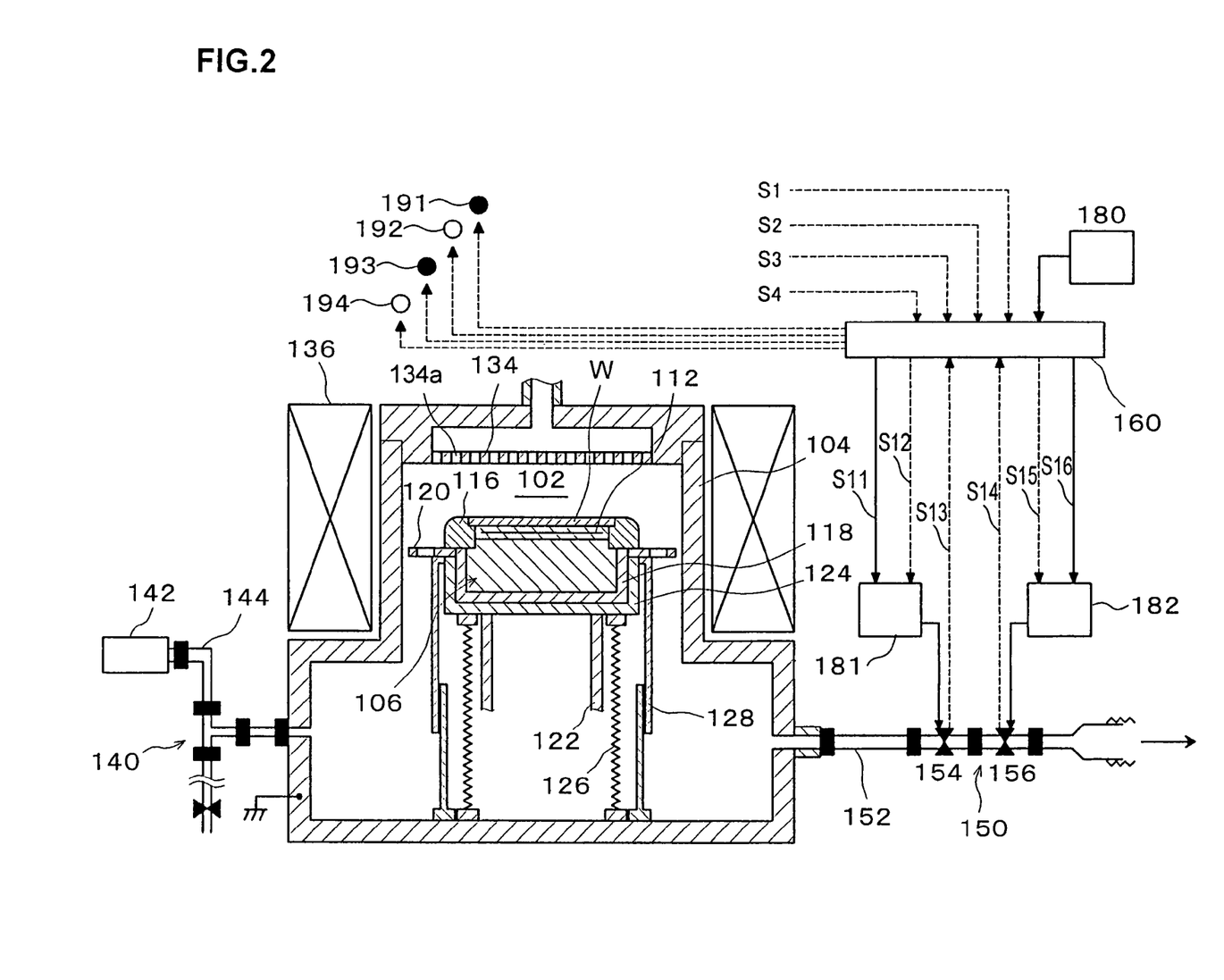
FIG. 2 schematically illustrates the processing apparatus achieved in a first embodiment.
Figure 3:
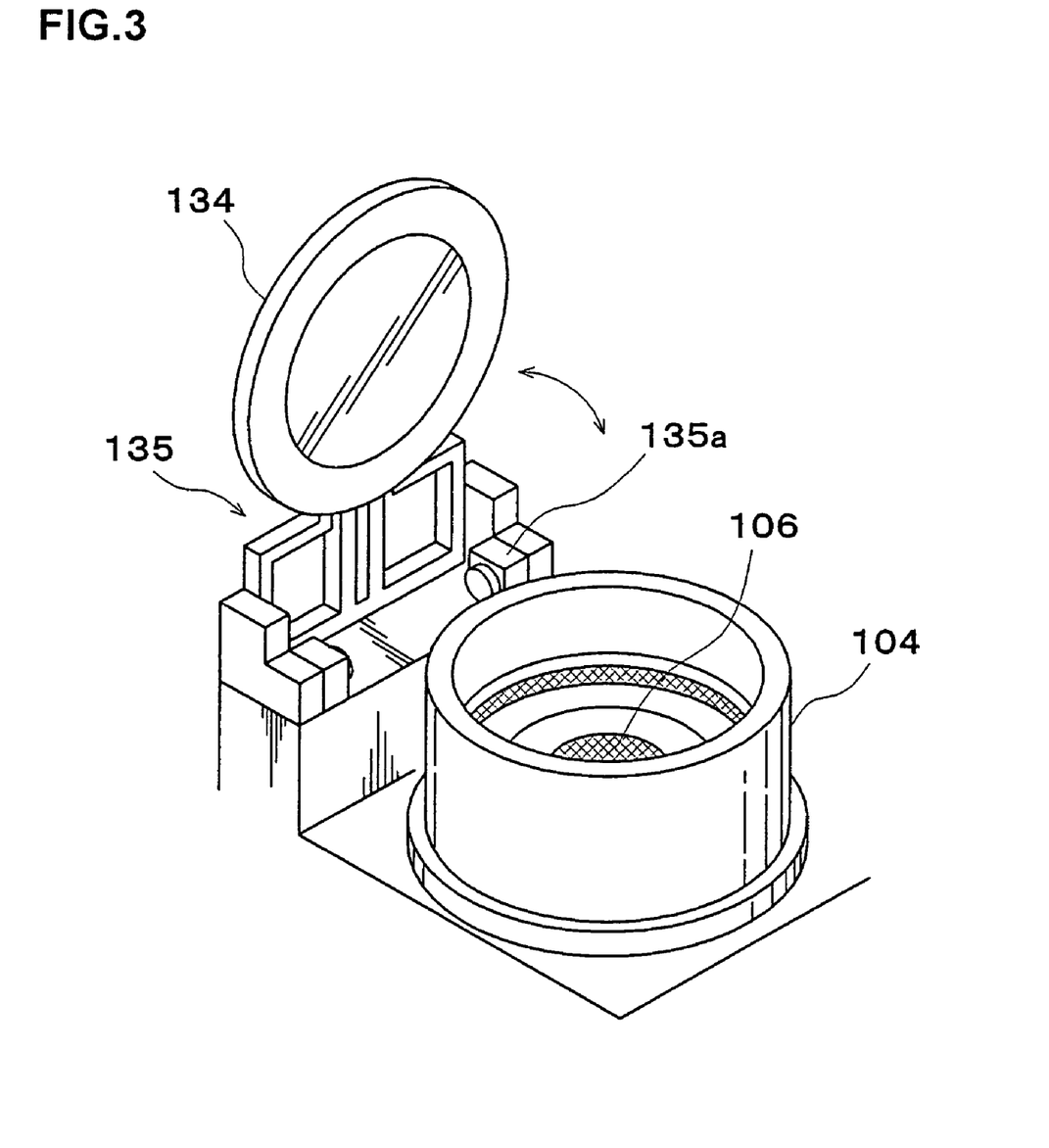
FIG. 3 illustrates the structure adopted in an upper electrode rotating mechanism.

Now, the first embodiment of the present invention is explained. This embodiment is characterized in that an atmosphere opening device for opening the processing chamber 102 to the atmosphere is included to constitute the air supply device of the chlorine based gas removal system utilized to remove the chlorine based gas from the processing chamber 102. Namely, as shown in FIG. 3, which presents an enlargement of the essential portion of the plasma processing apparatus in FIG. 2, a rotating mechanism 135 that rotates the upper electrode 134 is provided as the atmosphere opening device used to open the processing chamber 102 to the atmosphere. The rotating mechanism 135 is capable of freely rotating the upper electrode 134 around a support shaft 135a.

Figure 4:
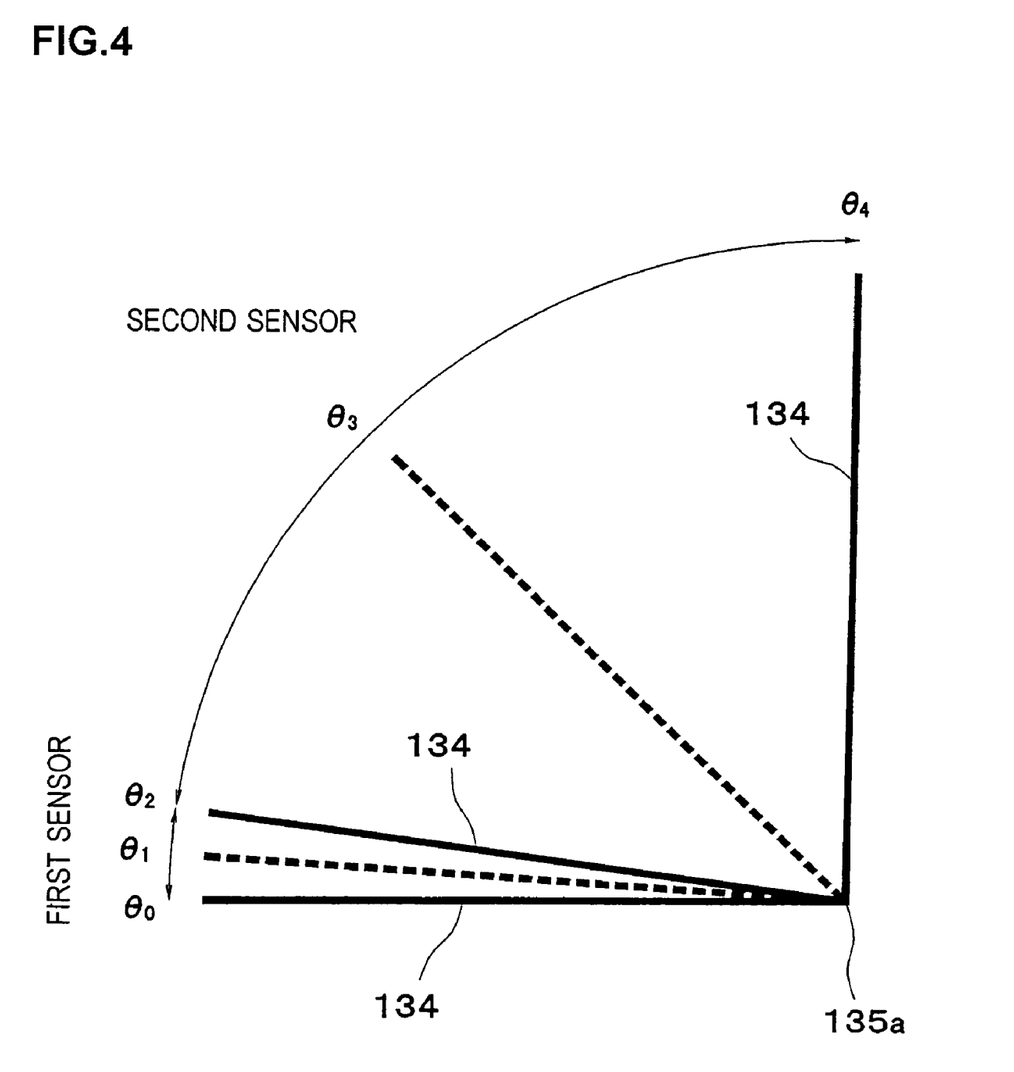
FIG. 4 illustrates sensor detection ranges.

FIG. 4 shows the relationship between the rotating angle of the upper electrode 134 to which the upper electrode 134 is caused to rotate by the rotating mechanism 135 shown in FIG. 3 and the sensors utilized to detect the rotating angle. In order to improve the control, two sensors (a first sensor and a second sensor) are used in combination in the embodiment.

1) The detection range of the first sensor is θ0 (the processing chamber is fully closed: 0°)~θ2 (the gas removal position: approximately 2°). The first sensor judges that the processing chamber is closed when the angle to which the upper electrode 134 is rotated by the rotating mechanism 135 is equal to or smaller than a threshold value θ1 (approximately 1°) and judges that the processing chamber is in an open state when the rotating angle is equal to or greater than θ1. When the rotating angle achieved by the rotating mechanism 135 is within the range of θ1 (approximately 1°)~θ2 (the gas removal position: approximately 2°) and thus, the processing chamber is determined to be in an open state, the first sensor outputs a processing chamber open signal S1 to a control unit 160. It is to be noted that the first sensor constitutes a component that characterizes the embodiment and is a new sensor which is not used in processing apparatuses in the related art.

2) The second sensor is the type of sensor provided in standard processing apparatuses. The detection range of the second sensor is θ2 (the gas removal position: approximately 2°)~θ4 (the processing chamber is fully open: over 90°). The second sensor judges that the processing chamber is closed when the angle to which the upper electrode 134 is rotated by the rotating mechanism 135 is equal to or smaller than a threshold value θ3 (approximately 45°) and judges that the processing chamber is in an open state when the rotating angle is equal to or greater than θ3. Thus, the gas removal position (θ2= approximately 2°) is set to approximately 2% of the position corresponding to the fully open state of the processing chamber (θ4= over 90°). When the rotating angle achieved by the rotating mechanism 135 is within the range of θ3 (approximately 45°)~θ4 (the processing chamber is fully open: 90°) and thus, the processing chamber is determined to be in an open state, the second sensor outputs a processing chamber open signal S2 to the control unit 160.

In order to remove the chlorine-based gas, N2 is supplied in addition to the atmospheric air. N2 is supplied into the processing chamber 102 through an N2 supply line 140. The pressure of the N2 is controlled through a pressure switch 142 provided at the N2 supply line. An N2 supply piping 144 is coated with Teflon for rust prevention.

The chlorine-based gas in the processing chamber 102 is removed by supplying N2 and atmospheric air into the processing chamber 102 and causing a reaction between the moisture in the atmospheric air and the chlorine-based gas. Acid produced through the reaction of the moisture in the atmospheric air and the chlorine-based gas is then evacuated through an acid evacuation line 150. The evacuation pressure is achieved by the negative pressure of the suction force applied for plant acid removal. An acid evacuation-side SUS piping 152 is coated with Teflon for rust prevention.

Two air operation valves (a front-stage air operation valve 154 and a rear-stage air operation valve 156) that are heated with a heater are mounted side-by-side onto the acid evacuation line 150. The specifications of these air operation valves 154 and 156 are as follows.

150° C. self temperature control (control range: 130~170° C.)

power consumption: 72 W, 100V×2 capable of outputting an alarm when the temperature deviates from the control range or a disconnection occurs, power is cut off at a thermal fuse when the temperature rises to an abnormal level It is to be noted that they are set in an ON state at all times since it takes 0.5~1 hour before the temperature becomes stable.

The front-stage air operation valve 154 and the rear-stage air operation valve 156 are controlled through different methods. Refer to the explanation of the control sequence provided later.

special quadruple-mount type solenoid valves are provided as a new feature

The control unit 160, which is connected to a power supply 180, controls the power supply to the air operation valves 154 and 156 (S11 and S16) and also implements specific control by using various signals including heater temperature control error detection signal (S13 and S14) input from the air operation valves 154 and 156 and ON/OFF signals (S12 and S15). In addition, the processing chamber open signal S1 from the first sensor, the processing chamber open signal S2 from the second sensor, an atmospheric air signal S3 from a convectron and a roughing evacuation start signal S4 are input to the control unit 160. In response to the signals S1~S4, the control unit 160 turns on/off or blinks the light emitting diodes to alert the operator to a specific state.

A green light emitting diode (green LED 191) is turned on when the processing chamber can be opened. A yellow light emitting diode (yellow LED 192) flashes when the apparatus has entered a standby state for an acid evacuation count start and is turned on while the acid evacuation count is in progress. A red light emitting diode (red LED 193) is turned on when the processing chamber cannot be opened. A white light emitting diode (white LED 194) flashes when the heater temperature is out of the control temperature range and is turned on when the heater temperature is at a normal level.

Figure 5:
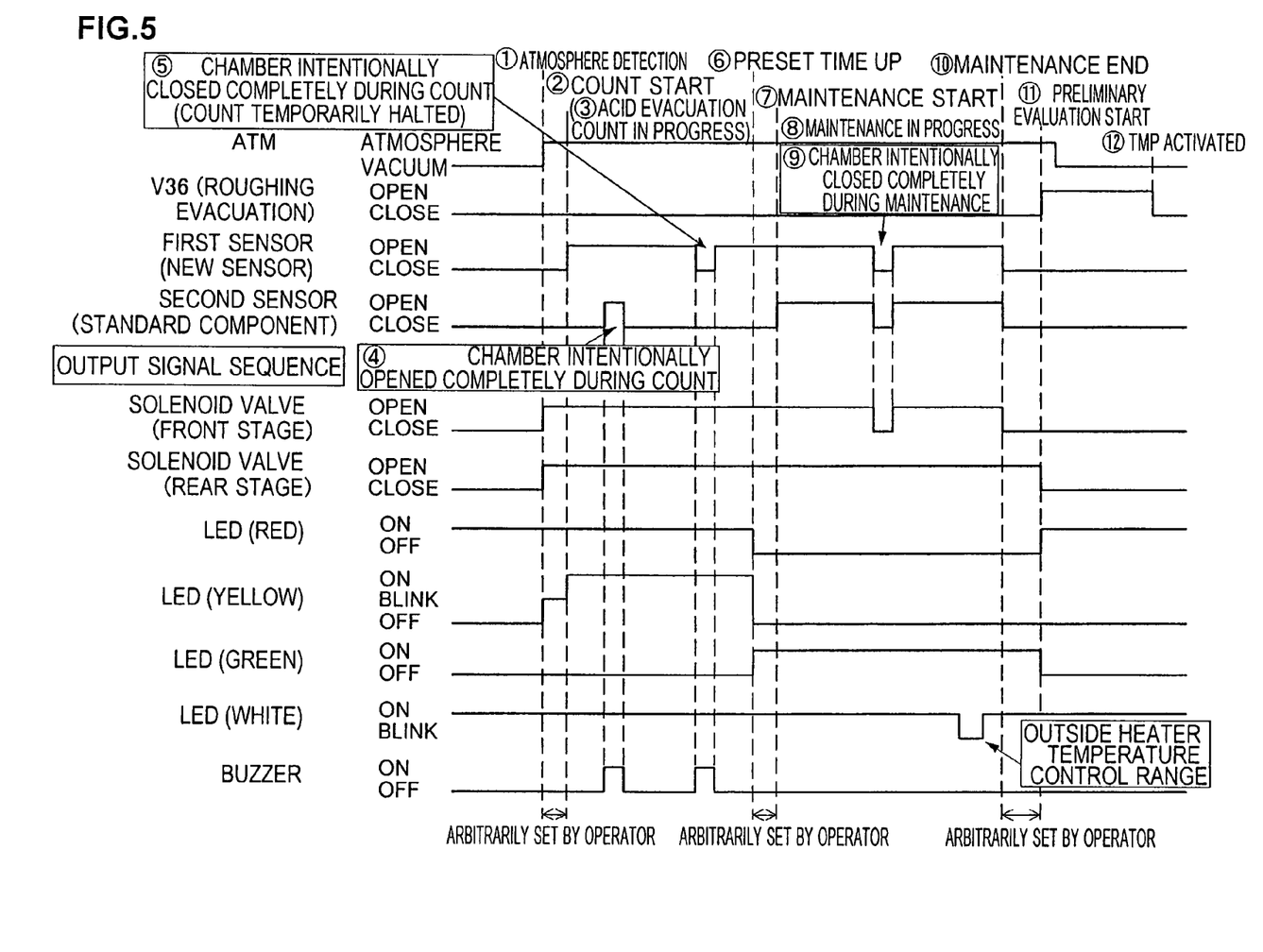
FIG. 5 illustrates the sequence of the gas removal processing.
Figure 6:
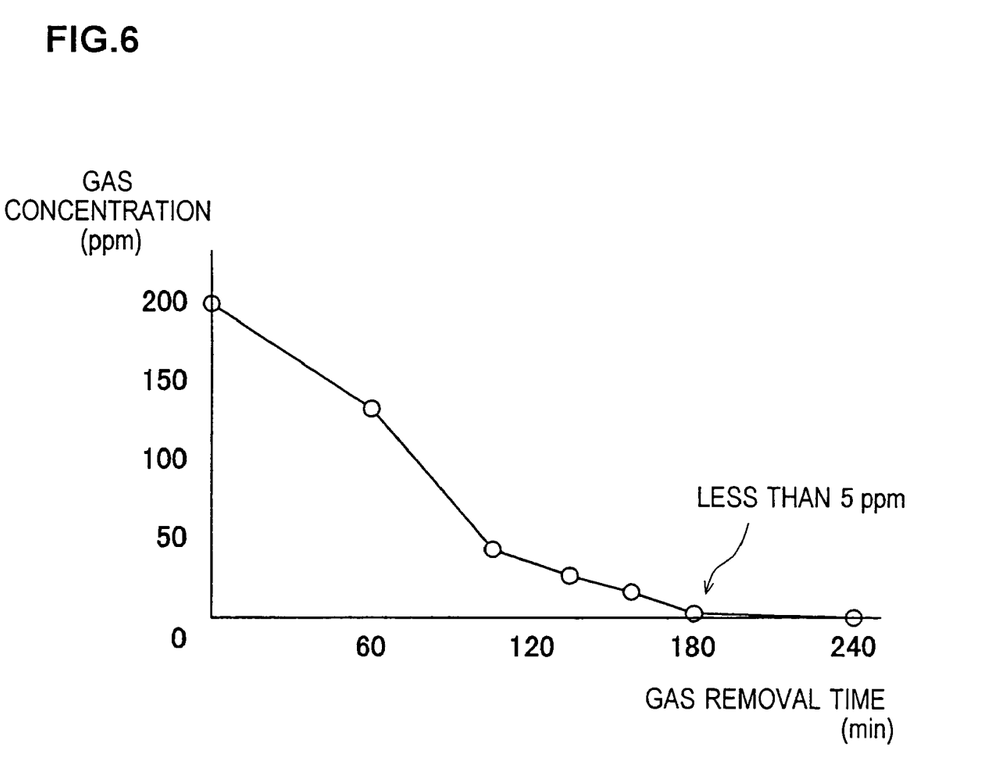
FIG. 6 shows the relationship between the length of the gas removal time and the gas concentration.

The gas removal method achieved in the plasma processing apparatus 100 adopting the gas removal system described above is now explained. FIG. 4 shows the sequence of the gas processing. In addition, FIG. 5 presents a graph of the relationship between the length of the gas removal time and the gas concentration.

1) Atmospheric Air Detection

When the atmospheric air signal S3 provided by the convectron is detected, both the front-stage air operation valve 154 and the rear-stage air operation valve 156 are opened. Since the processing chamber 102 is still closed at this point, a slight negative pressure is generated inside the processing chamber 102 due to the plant acid removal suction force. The yellow LED 192 starts to blink when the atmospheric air is detected to notify the operator that the apparatus has entered a standby state for a gas removal count start.

2) Count Start

As the upper electrode is moved to a specific position (the gas removal position θ2) while the yellow LED 192 is blinking, the processing chamber open signal S1 from the first sensor is detected and the count of the gas removal time starts. At this point, the yellow LED 192 which has been blinking enters a steady ON state to notify the operator that the gas removal count is in progress. It is to be noted that the length of time to elapse between "1) Atmospheric air detection" and "2) Count start" may be set freely by the operator.

3) During Gas Removal Count

During the gas removal process, the length of which has been preset, the gas inside the processing chamber 102 is evacuated. During this process, the red LED is on (indicating that the processing chamber 102 cannot be opened to the atmosphere) and the yellow LED is on (indicating that the gas removal count is in progress). In the graph shown in FIG. 5, the gas concentration goes under 5 ppm when 180 minutes elapses and it falls substantially to 0 ppm when 240 minutes elapses. Accordingly, it is recommended that the gas removal be executed for 240 minutes or more. However, it has been confirmed that through continuous evacuation, the gas concentration can be lowered to an acceptable level of less than 2 ppm within 180 minutes.

4) The Processing Chamber Opened to the Atmosphere During the Count

If the processing chamber is opened to the atmosphere while the gas removal count is in progress (if the processing chamber open signal S2 from the second sensor is detected), the rotating mechanism 135 for the upper electrode 134 issues a warning to alert the operator. Since fully opening the processing chamber during the gas removal count is strictly due to an operating error, it is assumed that the operator promptly closes the processing chamber in response to the warning. Thus, the gas removal timer continues to count the time elapsing during this erroneous operation.

5) The Processing Chamber Closed During the Count

If the processing chamber becomes closed during the gas removal count (if the processing chamber open signal from the first sensor is not detected), the rotating mechanism 135 of the upper electrode 134 issues a warning to alert the operator. However, unlike in the state described in 4), the processing chamber may become completely closed during the gas removal count out of necessity (there is a possibility that the processing chamber may remain in a closed state over an extended period of time) and, accordingly, the gas removal timer count becomes temporarily halted while the processing chamber is in a closed state. The count is resumed when the upper electrode is moved back to the gas removal position ($\theta1$) (when the processing chamber open signal S1 from the first sensor is detected). It is to be noted that since the two valves remain open while the count is temporarily halted, the pressure inside the processing chamber is sustained at a negative level and, for this reason, the chlorine-based gas is not allowed to flow out of the processing chamber when the processing chamber is opened to the atmosphere again.

6) End of the Preset Length of Time

7) Maintenance Start

When the gas removal count reaches the preset length of time, the green LED 191 is turned on (the yellow LED 192 and the red LED 193 become turned off) to indicate that the processing chamber can be opened to the atmosphere and thus the maintenance work can be initiated. It is to be noted that the length of time to elapse between "6) End of the preset length of time" and "7) Maintenance start" may be freely set by the operator.

8) During the Maintenance

Since the two valves remain in an open state during the maintenance work, a down flow is created inside the processing chamber to prevent the residual chlorine-based gas from flowing out toward the operator.

9) Closing the Processing Chamber Completely During Maintenance

If the processing chamber becomes fully closed (due to a temporary halt to the maintenance work or the like) during the maintenance process, the front-stage air operation valve 154 alone is closed in preparation for a roughing start (so as to prevent a backward flow of the gas from the plant acid removal line at the start of the roughing process. If the processing chamber is opened again without starting a roughing process, the front-stage air operation valve 154 is opened again and the operation returns to the maintenance mode described in 8) above.

10) Maintenance End

As the maintenance work is completed and the processing chamber is set in a fully closed state ($\theta0$) in preparation for a roughing start, the front-stage air operation valve 154 alone is closed prior to the start of the roughing process. This state is identical to the state described in 9) above.

11) Roughing Start

Upon detecting the roughing start signal S4, the rear-stage air operation valve 156, too, becomes closed. Since the front-stage air operation valve 154 has been in a closed state prior to this time point, the gas is not allowed to flow back into the processing chamber through the plant acid removal line. In response, the green LED 191 is turned off and the red LED 193 is turned on (to indicate that the processing chamber 102 cannot be opened to the atmosphere). It is to be noted that the length of time to elapse between "10) Maintenance end" and "11) Roughing start" may be set freely by the operator.

In addition, if the upper electrode is at the gas removal position ($\theta2$) (if the processing chamber open signal S1 from the first sensor is detected) when the maintenance work is completed and the roughing start signal S4 is detected, the second sensor may erroneously assume that the upper electrode at the gas removal position $\theta2$ is at the "closed" position and, as a result, the roughing process may start while the processing chamber is still open to the atmosphere. For this reason, if the upper electrode is at the gas removal position ($\theta2$) when the roughing start signal S4 is detected, a pseudo open signal is provided to the second sensor. Then, after the processing chamber becomes fully closed ($\theta0$), the roughing process is started.

If an error occurs in the temperature control system for the air operation valves 154 and 156 (if the heater temperature deviates from the control temperature range) in any of the steps taken during the sequence, the white LED 194 blinks (it remains on in a normal state). However, the gas removal sequence itself is not affected at all due to a forcible interruption or the like.

As explained above, in the embodiment in which the pressure inside the processing chamber 102 is reduced to a level which is at least lower than the atmospheric pressure (a negative pressure), the chlorine-based gas is not allowed to become diffused into the atmosphere even when the processing chamber 102 is open to the atmosphere. Thus, by opening the processing chamber 102 to the atmosphere, the atmospheric air can be taken in a large quantity. Since a large quantity of atmospheric air can be taken in by opening the processing chamber 102 to the atmosphere, the length of time required to produce acid through a reaction of the atmospheric air and the chlorine-based gas to remove the chlorine-based gas can be greatly reduced. In other words, while it takes approximately 300 minutes to achieve a chlorine-based gas concentration of less than 2 ppm at which the processing chamber can be opened safely in the related art, it becomes possible to remove the chlorine-based gas in 180 minutes or less through continuous evacuation.

In addition, since the processing chamber 102 can be opened to the atmosphere by using the rotating mechanism 135 of the upper electrode 134, the structure of the apparatus does not need to be modified greatly.

Furthermore, since a locking mechanism that locks the atmosphere opening device when the pressure inside the processing chamber is equal to or higher than a predetermined level is provided, any leakage of the chlorine-based gas is prevented and thus, the safety of the maintenance work can be increased.

Moreover, better control is achieved with two sensors, the first sensor and the second sensor.

While the rotating mechanism 135 issues a warning for the operator if the processing chamber becomes open to the atmosphere or becomes closed while a gas removal count is in progress in the embodiment described above, the present invention is not limited to this example. For instance, the upper electrode 134 may be locked at a fixed position so as to disallow rotation thereof during a gas removal count to ensure that the processing chamber does not become opened to the atmosphere or completely closed off.

In addition, the processing chamber may be determined to have been opened to the atmosphere during a gas removal count when the upper electrode 134 is set to the full open position (θ4) or when it is decided that the processing chamber is in an open state (θ3)~(θ4). Likewise, the processing chamber may be determined to have been completely closed when the upper electrode 134 is set to the full closed position (θ0) or when it is decided that the processing chamber is in a closed state (θ0)~(θ1).

(Second Embodiment)

Next, the second embodiment of the present invention is explained. This embodiment is characterized in that the air supply device is constituted of a device that supplies a gas to be used for chlorine-based gas removal into the processing chamber 102 through the supply ports through which the process gas used in the plasma processing executed in the processing chamber 102 is supplied, i.e., through the gas outlet holes 134a in this example, instead of the atmosphere opening device in the first embodiment. Namely, the supply paths for the process gas and the atmospheric air are partially integrated.

Figure 7:
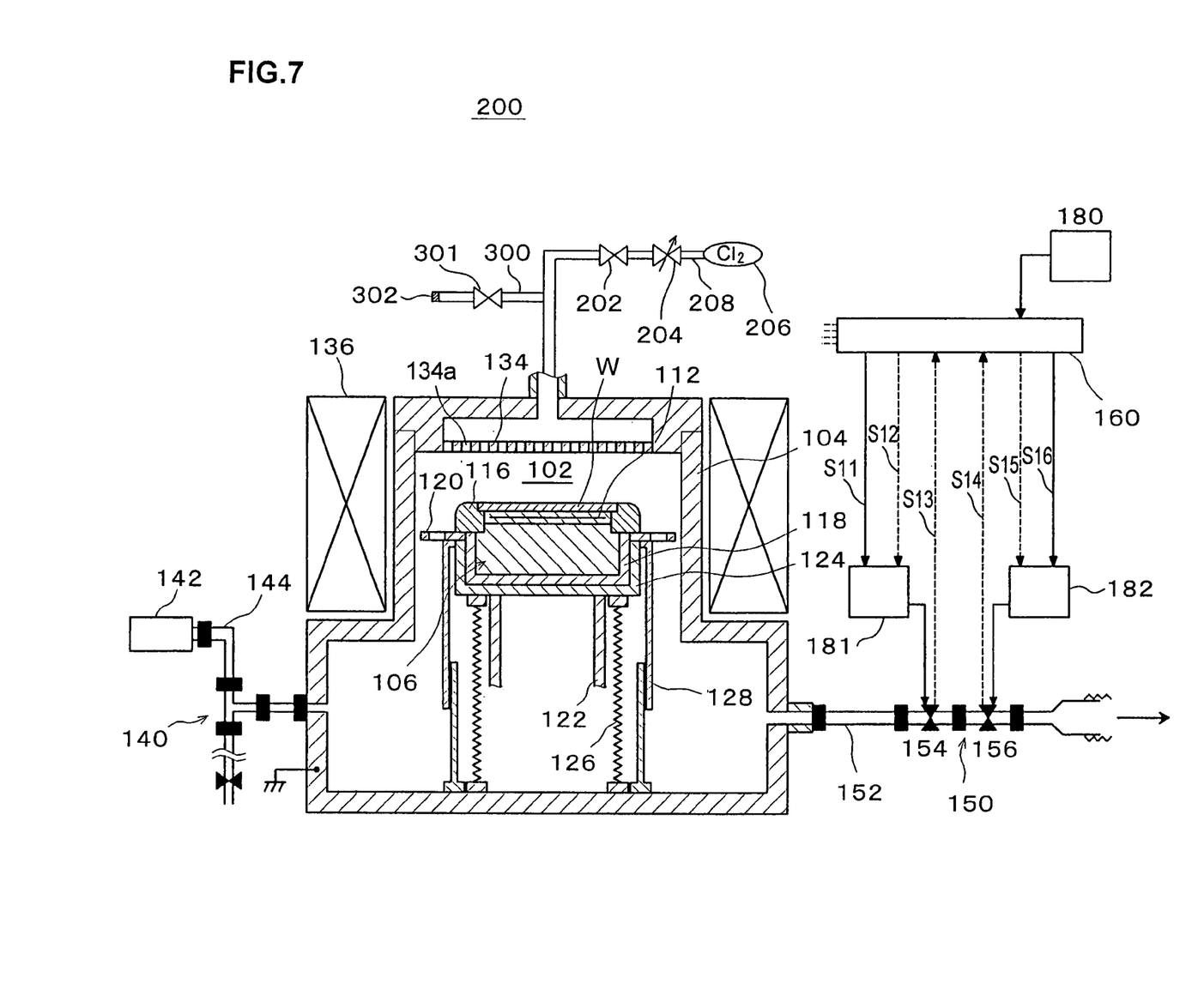
FIG. 7 schematically illustrates the plasma processing apparatus achieved in a second embodiment.

FIG. 7 shows the features of the embodiment. It is to be noted that the components in FIG. 7 that are identical to those in the first embodiment are not explained.

A process gas supply device 200 is constituted of a chlorine-based gas supply system 208, gas outlet holes 134a and the like. In the embodiment, an atmospheric air supply system 300 and a switching valve 301 to be utilized to supply the atmospheric air present around the processing chamber into the processing chamber through the gas outlet holes 134a are connected to the chlorine-based gas supply system 208 at a specific position. It is to be noted that a mesh 302 may be provided at the atmosphere-side end of the atmospheric air supply system 300 to function as a filter that prevents entry of dust in the atmosphere into the atmospheric air supply system 300.

During the actual chlorine-based gas removal process executed by adopting the structure described above, the air operation valves 154 and 156 are first opened to reduce the pressure inside the processing chamber 102. As a sensor detects that the pressure inside the processing chamber 102 has been lowered to a predetermined level (approximately 2Torr), the switching valve 301 is opened to let the atmospheric air into the atmospheric air supply system 300. Since the pressure inside the processing chamber has been lowered, the chlorine-based gas inside the processing chamber is not released to the outside through the atmospheric air supply system and, instead, the atmospheric air present around the processing chamber travels through the atmospheric air supply system 300 and is supplied into the processing chamber through the gas outlet holes 134a.

The moisture in the atmospheric air supplied into the processing chamber reacts with the chlorine-based gas inside the processing chamber and produces acid which is then evacuated through the acid evacuation line 150.

By allowing the process gas supply device 200 to bypass the atmospheric air supply system 300, supplying the atmospheric air from the environment into the processing chamber through the atmospheric air supply system 300 after lowering the pressure inside the processing chamber and evacuating the acid produced through the reaction of the moisture in the atmospheric air and the chlorine-based gas in the processing chamber as in the embodiment, the chlorine-based gas can be evacuated in a manner similar to that achieved in the first embodiment and furthermore, the chlorine-based gas evacuation is achieved through a simpler structure compared to the first embodiment. Moreover, since a large drive system is not required, the chlorine-based gas removal system can be automated with ease.

(Third Embodiment)

The third embodiment of the present invention is now explained. While the air supply device in the second embodiment is achieved by allowing the process gas supply device 200 to bypass the atmospheric air supply system 300, in the third embodiment, the atmospheric air supply system is made to directly connect the processing chamber to enable removal of the chlorine-based gas inside the processing chamber.

Figure 8:
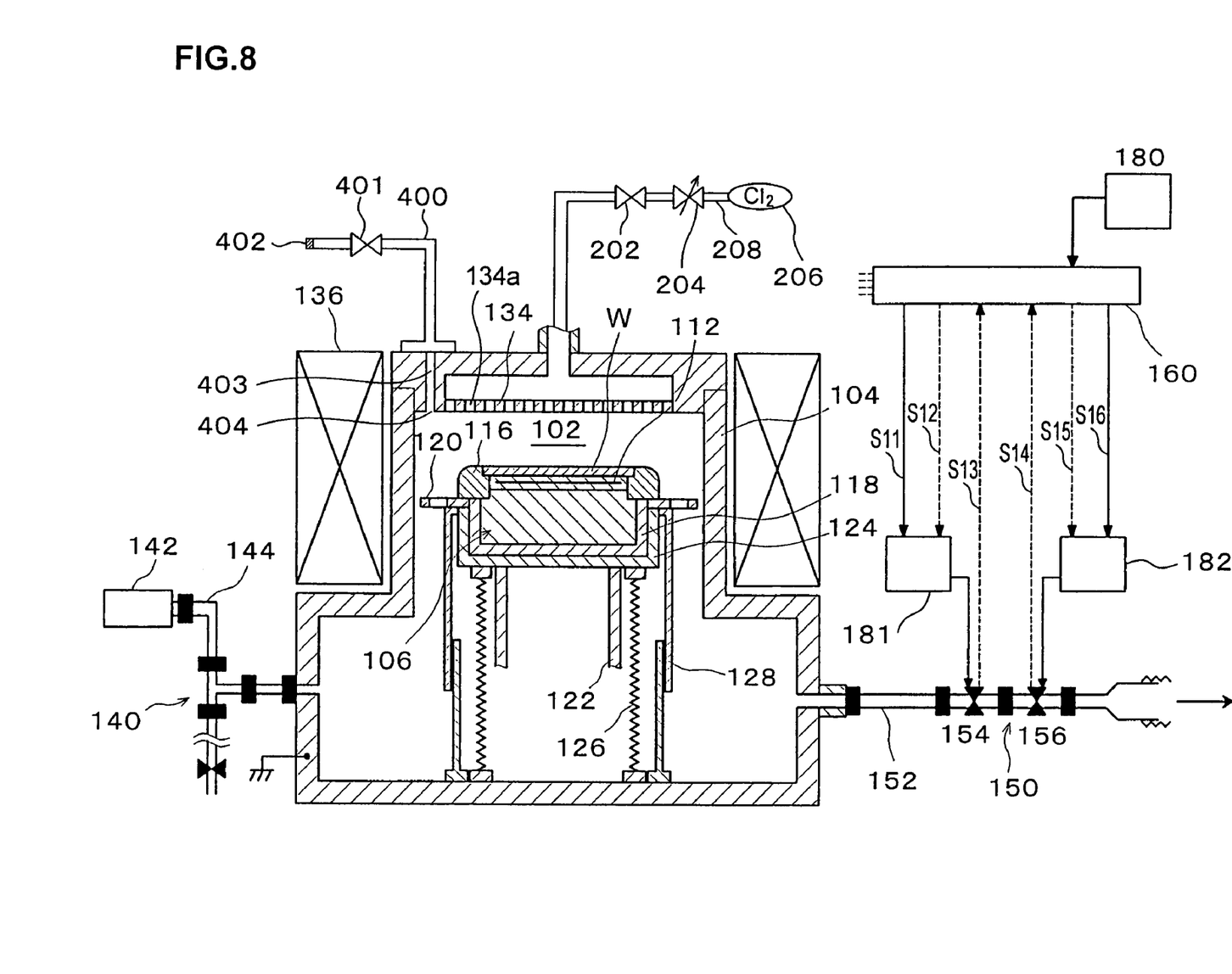
FIG. 8 schematically illustrates the plasma processing apparatus achieved in a third embodiment.

FIG. 8 shows the features of the embodiment. It is to be noted that the components in FIG. 8 that are identical to those in the first embodiment are not explained.

As FIG. 8 clearly illustrates, an atmospheric air supply system 400 is directly connected at the external surface of the processing chamber 102 in order to directly supply the atmospheric air present in the vicinity of the processing chamber into the processing chamber and a hole 403 is formed at the top of the processing chamber to allow the atmospheric air to flow from the atmospheric air supply system 400 into the processing chamber 102. The atmospheric air supply system 400 includes a switching valve 401. In addition, as in the second embodiment, a mesh 402 may be provided at the atmosphere-side end of the atmospheric air supply system 400 to function as a filter which prevents entry of dust in the atmosphere into the atmospheric air supply system 400.

During the actual chlorine-based gas removal process executed by adopting the structure described above, the air operation valves 154 and 156 are first opened to reduce the pressure inside the processing chamber 102, as in the second embodiment. As a sensor detects that the pressure inside the processing chamber 102 has been lowered to a predetermined level (approximately 2Torr), the switching valve 401 is opened to let the atmospheric air into the atmospheric air supply system 400. Since the pressure inside the processing chamber 102 has been lowered, the chlorine-based gas inside the processing chamber 102 is not released to the outside through the atmospheric air supply system 400 and, instead, the atmospheric air present in the environment travels through the atmospheric air supply system 400 and through the hole 403 formed at the processing chamber and is supplied into the processing chamber 102 through an atmospheric air outlet hole 404.

The moisture in the atmospheric air supplied into the processing chamber reacts with the chlorine-based gas inside the processing chamber and produces acid which is then evacuated through the acid evacuation line 150.

By allowing the atmospheric air supply system 400 to directly connect to the processing chamber 102, providing the hole 403 and the atmospheric air outlet hole 404 at the processing chamber 102 supplying the atmospheric air around the processing chamber 102 into the processing chamber and evacuating the acid produced through the reaction of the moisture in the atmospheric air and the chlorine-based gas inside the processing chamber as in the embodiment, the chlorine-based gas can be evacuated as effectively as in the first embodiment. Furthermore, the chlorine-based gas evacuation can be achieved through a simpler structure compared to the first embodiment. Moreover, since a large drive system is not required, the chlorine-based gas removal system can be automated with ease.

While the invention has been particularly shown and described with respect to preferred embodiments of the halogen gas removal method and the halogen gas removal system according to the present invention by referring to the attached drawings, the present invention is not limited to these examples and it will be understood by those skilled in the art that various changes in form and detail may be made therein without departing from the spirit, scope and teaching of the invention.

As explained above, according to the present invention, in which the pressure inside the processing chamber is reduced to a level which is at least lower than the atmospheric pressure (reduced to a negative pressure), the halogen gas is not allowed to become diffused to the outside of the processing chamber when the atmospheric air is supplied into the processing chamber. As a result, the reaction product, i.e., acid, resulting from the reaction of the supplied atmospheric air and the gas present in the processing gas can be evacuated to achieve quick and reliable removal of the gas. In addition, since the pressure inside the processing chamber is sustained at a negative level, there is no irritating odor of the gas and the gas leakage detector does not go off during the subsequent maintenance work, thereby assuring safety of the maintenance personnel.

The present invention may be adopted in plasma processing executed by using a halogen gas during the process of manufacturing, for instance, semiconductor devices.

What is claimed is:

1. A gas removal system, that removes a halogen gas remaining inside a processing chamber after executing processing inside said processing chamber in an airtight state and obtaining plasma through discharge dissociation of a process gas, which contains the halogen gas supplied from a process gas supply system, comprising:
    a pressure control device that controls the pressure inside said processing chamber;
    an air supply device that supplies atmospheric air into said processing chamber after lowering the pressure inside said processing chamber with said pressure control device,
        wherein lowering pressure inside said processing chamber prevents diffusion of the halogen gas to an atmosphere outside said processing chamber,
        wherein said air supply device comprises an atmosphere opening device that opens said processing chamber to an atmosphere outside of the processing chamber,
        wherein said atmosphere opening device comprises a rotating mechanism for rotating said process gas supply system;
    a control device that controls said air supply device;
    an evacuation device that evacuates a gas produced through a reaction of the halogen gas and the atmospheric air having occurred in said processing chamber; and
    a sensor that detects an extent to which said processing chamber is opened to the atmosphere by said atmosphere opening device.

2. A gas removal system according to claim 1, wherein:
    the extent to which said processing chamber is open to the atmosphere by said atmosphere opening device comprises a first degree at which said processing chamber is not opened to the atmosphere at all, a second degree at which said processing chamber is opened to the atmosphere to a predetermined extent to remove the gas and a third degree at which said processing chamber is completely open to the atmosphere; and
    said sensor comprises a first sensor having a detection range from the first degree to the second degree and a second sensor having a detection range from the second degree to the third degree.

3. A gas removal system according to claim 2, wherein:
    said second degree is approximately 2% of said third degree.

4. A gas removal system according to claim 2, wherein:
    said atmosphere opening device issues a warning if said first sensor detects that the extent to which said processing chamber is opened to the atmosphere is the first degree before a predetermined length of time elapses.

5. A gas removal system according to claim 2, wherein:
    said atmosphere opening device issues a warning if said second sensor detects that the extent to which said processing chamber is opened to the atmosphere is the third degree before a predetermined length of time elapses.

6. A gas removal system according to claim 1, wherein:
    said halogen gas is chlorine.

7. A gas removal system according to claim 1, wherein:
    said halogen gas is hydrogen bromide.

8. A plasma processing apparatus, that executes plasma processing on a workpiece placed inside a processing chamber, comprising:
    a pressure control device that controls the pressure inside said processing chamber;
    an air supply device that supplies atmospheric air into said processing chamber after lowering the pressure inside said processing chamber with said pressure control device,
        wherein lowering pressure inside said processing chamber prevents diffusion of a halogen gas to an atmosphere outside said processing chamber,
        wherein said air supply device comprises an atmosphere opening device that opens said processing chamber to an atmosphere outside of the processing chamber,
        wherein said atmosphere opening device comprises a rotating mechanism for rotating a process gas supply device;
    a control device that controls said air supply device; and
    an evacuation device that evacuates a gas produced through a reaction of the halogen gas and the atmospheric air having occurred in said processing chamber; and
    a sensor that detects an extent to which said processing chamber is opened to the atmosphere by said atmosphere opening device.

* * * * *